US009064844B2

(12) United States Patent
Moffitt

(10) Patent No.: US 9,064,844 B2
(45) Date of Patent: Jun. 23, 2015

(54) LASER REFLECTOMETRY FOR SUBSTRATE PROCESSING

(71) Applicant: Theodore P. Moffitt, Hillsboro, OR (US)

(72) Inventor: Theodore P. Moffitt, Hillsboro, OR (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 297 days.

(21) Appl. No.: 13/683,026

(22) Filed: Nov. 21, 2012

(65) Prior Publication Data

US 2013/0146568 A1 Jun. 13, 2013

Related U.S. Application Data

(60) Provisional application No. 61/567,969, filed on Dec. 7, 2011.

(51) Int. Cl.

| | |
|---|---|
| ***B23K 26/06*** | (2014.01) |
| ***H01L 21/428*** | (2006.01) |
| ***B23K 26/03*** | (2006.01) |
| ***B23K 26/12*** | (2014.01) |
| *H01L 21/02* | (2006.01) |
| *H01L 21/268* | (2006.01) |
| *H01L 21/324* | (2006.01) |

(52) U.S. Cl.

CPC .............. *H01L 21/428* (2013.01); *B23K 26/06* (2013.01); *H01L 21/0231* (2013.01); *B23K 26/0626* (2013.01); *B23K 26/034* (2013.01); *B23K 26/127* (2013.01); *H01L 21/268* (2013.01); *H01L 21/324* (2013.01)

(58) Field of Classification Search

CPC ........... H01L 21/00; C03B 1/00; B23K 26/00

USPC ............. 219/121.61–121.72, 121.76, 121.77, 219/121.83, 121.85, 121.86; 250/492.1; 359/237, 238; 372/20; 356/326, 432

See application file for complete search history.

(56) References Cited

U.S. PATENT DOCUMENTS

| | | | |
|---|---|---|---|
| 5,543,912 A | 8/1996 | Kada et al. | |
| 6,407,360 B1 * | 6/2002 | Choo et al. | 219/121.67 |
| 6,447,370 B1 | 9/2002 | Weldon | |
| 6,717,106 B2 * | 4/2004 | Nagano et al. | 219/121.83 |
| 6,940,592 B2 * | 9/2005 | Borden et al. | 356/326 |

(Continued)

FOREIGN PATENT DOCUMENTS

JP 2007-271399 A 10/2007

OTHER PUBLICATIONS

International Search Report and Written Opinion dated Mar. 21, 2013, Patent Application: PCT/US2012/065186.

*Primary Examiner* — Samuel M Heinrich
(74) *Attorney, Agent, or Firm* — Patterson & Sheridan, LLP

(57) ABSTRACT

Embodiments of the present invention relate to methods and apparatus for control of laser devices and safety features related to utilization of laser devices in substrate processing systems. In one embodiment, a system for processing a substrate is provided. The system includes a chamber having a processing volume, a first laser device to emit a beam at a first wavelength into the processing volume, and a second laser device to emit a beam at a second wavelength into the processing volume, wherein the second wavelength is different than the first wavelength, and the second laser device comprises a filter adapted to attenuate one or both of the first wavelength and the second wavelength.

20 Claims, 3 Drawing Sheets

(56) References Cited

U.S. PATENT DOCUMENTS

| | | | | |
|---|---|---|---|---|
| 8,115,137 | B2 | 2/2012 | Kawaguchi et al. | |
| 2005/0037615 | A1* | 2/2005 | Cabib et al. | 438/689 |
| 2005/0094547 | A1* | 5/2005 | Sugiyama et al. | 369/275.4 |
| 2005/0272185 | A1* | 12/2005 | Seki et al. | 438/149 |
| 2006/0234458 | A1 | 10/2006 | Jennings et al. | |
| 2010/0128356 | A1 | 5/2010 | Feklistov et al. | |
| 2011/0006044 | A1 | 1/2011 | Li et al. | |
| 2011/0013654 | A1 | 1/2011 | Yamazaki | |
| 2011/0243159 | A1 | 10/2011 | Murison et al. | |
| 2012/0189323 | A1 | 7/2012 | Xu et al. | |

* cited by examiner 208
142
128

146
212
200
144
136
206
124
CONTROLLER
204
127
LASER SOURCE
202
125
214
216

210
208
128
142
144
136
200
206
124
CONTROLLER
204
127
LASER SOURCE
202
125
214
216

LASER REFLECTOMETRY FOR SUBSTRATE PROCESSING

CROSS-REFERENCE TO RELATED APPLICATIONS

This application claims benefit of U.S. Provisional Patent Application Ser. No. 61/567,969, filed Dec. 7, 2011, which is hereby incorporated by reference herein.

BACKGROUND OF THE INVENTION

1. Field of the Invention

Embodiments of the invention generally relate to methods and apparatus for laser reflectometry in substrate processing systems. More specifically, embodiments described herein relate to improving efficiency of laser devices and safety features related to utilization of laser devices in thermal processing systems.

2. Description of the Related Art

Thermal processing is commonly practiced in the semiconductor industry. Semiconductor substrates are subjected to thermal processing in the context of many transformations, including doping, activation, and annealing of gate source, drain, and channel structures, siliciding, crystallization, oxidation, and the like. Over the years, techniques of thermal processing have progressed from simple furnace baking, to various forms of increasingly rapid thermal processing such as RTP, spike annealing, and laser annealing.

Conventional laser annealing processes use laser emitters that may be semiconductor or solid state. A common approach is to image the laser light into a line or thin rectangular image that is scanned across a substrate (or the substrate moved relative to the laser light) to process the entire surface of the substrate.

Metrology techniques are typically utilized to monitor and control the annealing process. In some conventional laser annealing processes, laser reflectometry is utilized to provide real-time metrology information. Laser reflectometry typically utilizes a semiconductor laser (e.g., a diode laser) and a sensor. Light from the semiconductor laser is directed towards the substrate and the light reflected from the substrate is received by the sensor. Information from the sensor is provided to a device for monitoring and/or control of the annealing process.

The use of multiple lasers in an annealing process creates challenges. Light from the laser emitter utilized for annealing may interfere with the light from the semiconductor laser, which may alter the properties of the beam emitted from the semiconductor laser. Likewise, the sensor may be sensitive to light outside of the wavelengths associated with the beam from the semiconductor laser. Thus, light from the laser emitter utilized for annealing may cause deviations in the metrology information. Additionally, the semiconductor laser may require adjustments to the beam to ensure alignment of the beam to a specific target area of the substrate and/or ensure alignment of the beam with the sensor. These adjustments are often performed manually by personnel. However, the intensity of the beam from the semiconductor laser is in a range that is harmful to human vision and/or human skin. Thus, tinted safety glasses and protective clothing are required when the beam is being adjusted. However, the tinted safety glasses may obscure areas of interest and may require personnel to remove the glasses to view the areas of interest. Removal of safety glasses may cause inadvertent exposure to light from the semiconductor laser, which poses a safety risk to personnel.

Thus, there is a need for apparatus and methods for controlling lasers and beams from the lasers in order to enhance metrology information and manage safety risks.

SUMMARY OF THE INVENTION

Embodiments of the present invention relate to methods and apparatus for control of laser devices and safety features related to utilization of laser devices in substrate processing systems. In one embodiment, a system for processing a substrate is provided. The system includes a chamber having a processing volume, a first laser device to emit a beam at a first wavelength into the processing volume, and a second laser device to emit a beam at a second wavelength into the processing volume, wherein the second wavelength is greater than the first wavelength, and the second laser device comprises a filter adapted to attenuate one or both of the first wavelength and the second wavelength.

In another embodiment, a system for processing a substrate is provided. The system includes a chamber having an internal volume, a first laser emitter configured to emit a process beam into the internal volume, and a metrology system disposed at least partially within the internal volume. The metrology system comprises a second laser emitter that includes a housing, a laser source disposed in the housing, the laser source generating a primary beam that is directed through an aperture in the housing, a first filter disposed on the housing and covering the aperture, and a sensor having a second filter, the sensor being in communication with the primary beam, wherein the first and second filters are transparent to the primary beam and attenuate the process beam.

In another embodiment, a method for processing a substrate is provided. The method includes emitting a process beam at a first wavelength toward a portion of a substrate, emitting a primary beam at a second wavelength toward the portion of the substrate, wherein the second wavelength is different than the first wavelength, and receiving, within a sensor, a reflected beam from the substrate, wherein the reflected beam that is received in the sensor consists essentially of the second wavelength.

BRIEF DESCRIPTION OF THE DRAWINGS

So that the manner in which the above recited aspects of the invention can be understood in detail, a more particular description of embodiments of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments described herein relate to laser devices and safety features related to utilization of laser devices in substrate processing systems. The substrate processing system is exemplarily described as an annealing system and process, but some embodiments of the invention may be applicable to other systems and processes that utilize laser devices. Additionally, one or more of the laser devices described herein is exemplarily described as a semiconductor laser, such as a diode laser. However, some embodiments of the invention may be applicable to other laser devices, including, but not limited to, solid state lasers, excimer lasers, or other laser devices that utilize optical feedback to control beam output, as well as other laser devices that require periodic beam adjustment by personnel.

Figure 1:
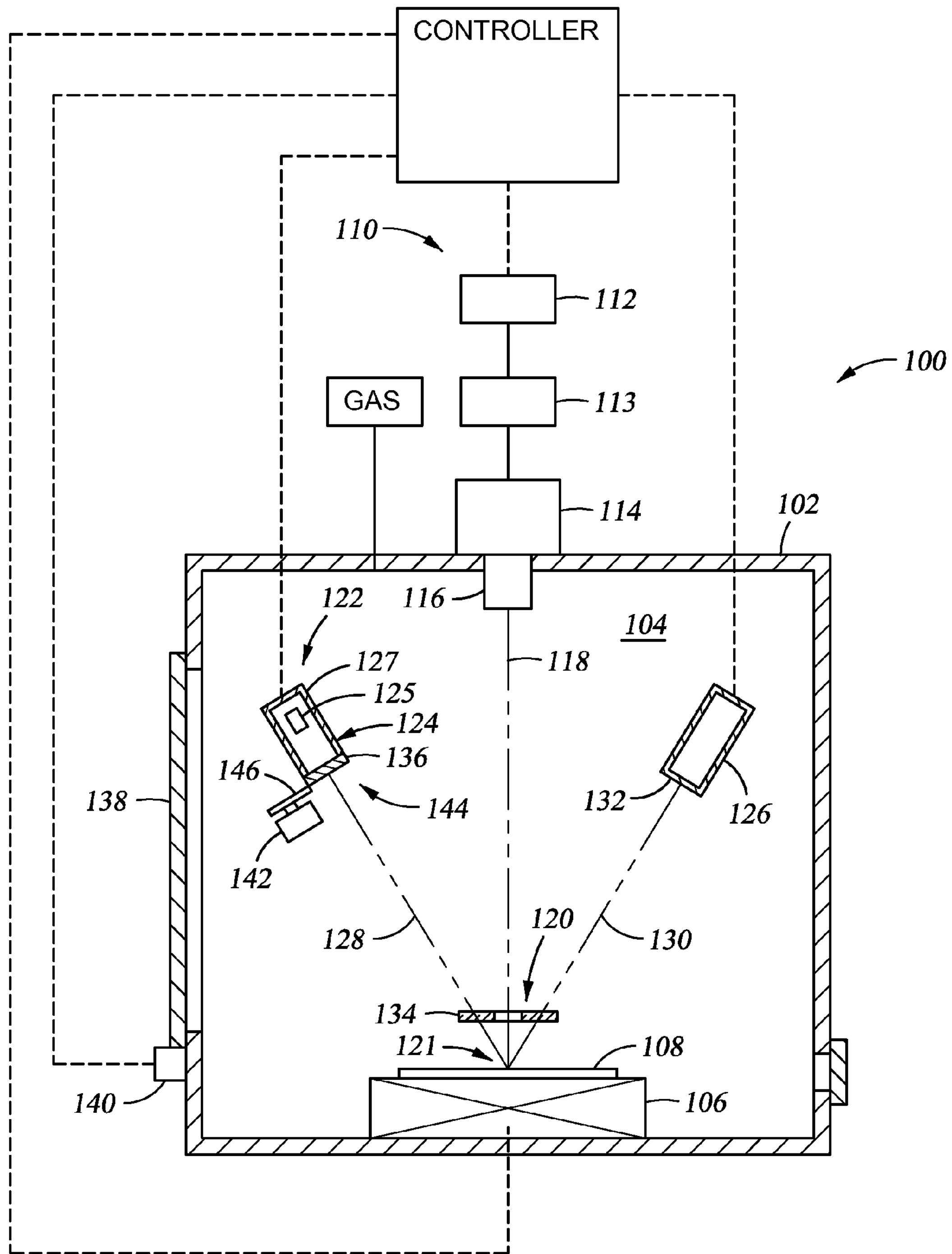
FIG. 1 is a schematic cross-sectional view of a thermal processing chamber showing one embodiment of the invention.

FIG. 1 is a schematic cross-sectional view of a thermal processing chamber 100 showing one embodiment of the invention. The thermal processing chamber 100 comprises a chamber body 102 that encloses a processing volume 104. The processing volume 104 includes a substrate support 106 which supports a substrate 108 during a thermal process, such as an annealing process. The thermal processing chamber 100 also includes a process laser system 110. The process laser system 110 comprises a laser power source 112, a beam optics module 114 and an aperture 116 that provides a process beam 118 that is directed toward the substrate 108. The process beam 118 is typically shaped and sized to a cover a relatively small surface area of the substrate 108. Thus, the process beam 118 and the substrate 108 must be moved relative to each other during the annealing process in order to anneal the substrate 108. In the exemplary thermal processing chamber 100, the substrate support 106 is adapted to move relative to the process beam 118. The substrate support 106 may be moved in the X and Y direction based on commands from a controller during the annealing process.

The process laser system 110 may include one or more laser devices 113 to provide the process beam 118. The process beam 118 may be continuous or pulsed. The beam optics module 114 may include beam splitters, combiners, polarizers, amplifiers, homogenizing devices, and mirrors that produce the process beam 118 in a continuous or pulsed mode. The process beam 118 may pass through a window 120 disposed in the processing volume 104 between the aperture 116 and the substrate 108. The window 120 is generally transmissive to light from the process beam 118 and allows the process beam 118 to pass therethrough to form a heated area 121 on the substrate 108 during an annealing process. The window 120 provides a shield to prevent debris from the heated area 121 of the substrate 108 from depositing on the aperture 116, as well as other surfaces in the processing volume 104. While not shown, the thermal processing chamber 100 may include more than one process laser system 110 for providing multiple process beams that may be used in the annealing process.

The thermal processing chamber 100 also includes a metrology system 122 that includes an emitter 124 and a sensor 126. The emitter 124 comprises a housing 127 that contains a laser device that emits a primary beam 128 toward the substrate 108. The primary beam 128 may pass through the window 120 and substantially intersect with the process beam 118 in the heated area 121 of the substrate 108. A secondary beam 130 is reflected from the heated area 121 of the substrate 108 to the sensor 126. The primary beam 128 and/or the secondary beam 130 may be angled about 30 degrees to about 50 degrees relative to the process beam 118. The metrology system 122 may utilize the emitter 124 and sensor 126 to monitor changes in temperature of the heated area 121 of the substrate 108, changes in reflectivity of the heated area 121 of the substrate 108, and combinations thereof, to monitor and control the annealing process. Signals from the sensor 126 are communicated to a controller where process variables, such as the intensity of the process beam 118, direction and/or speed of the substrate support 106, and combinations thereof, may be adjusted.

The processing volume 104 typically includes an atmosphere that is non-interfering with wavelengths associated with the process beam 118, as well as the primary beam 128 and the secondary beam 130. Thus, the processing volume 104 may be coupled to a vacuum pump (not shown) and/or is coupled to a gas source that may provide an inert gas to the processing volume 104.

In one embodiment, the process beam 118 comprises a wavelength of about 495 nm and about 570 nm, for example about 532 nm. In this embodiment, the process beam 118 may be a green light. However, the process beam 118 may be a blue light (e.g., at a wavelength of about 450-495 nm) or a red light (e.g., at a wavelength of about 620-750 nm). The primary beam 128 from the emitter 124 comprises a wavelength that is different than the wavelength of the process beam 118. As the substrate 108 may emit radiation at the heated area 121 during an annealing process, the primary beam 128 may also comprise a wavelength that is different than light that may be produced on the heated area 121 of the substrate 108. The sensor 126 is sensitive to the wavelength of the primary beam 128. The wavelength of the primary beam 128 may be determined based on the wavelength of the process beam 118 and/or any wavelengths that may be produced at the heated area 121 of the substrate 108. The differing wavelengths (i.e., different colors) between the process beam 118 and the primary beam 128 minimizes cross-talk between the process beam 118 and the primary beam 128, as well as minimizes detection of any light at wavelengths that are not necessary for metrology purposes.

For example, if the process beam 118 is green light, the primary beam 128 may comprise a red light (e.g., a wavelength of about 620 nm to about 750 nm, such as about 658 nm). The wavelength of the primary beam 128 is not limited to red light and may be any wavelength that is different than the wavelength of the process beam 118, and/or any wavelengths that may be produced on the heated area 121 of the substrate 108.

The sensor 126 is also capable of receiving wavelengths, via the secondary beam 130, that are at or near the wavelength of the primary beam 128. However, the sensor 126 may be sensitive to wavelengths outside of the wavelength of the primary beam 128. For example, the sensor 126 may be sensitive to a broader range of wavelengths, such as between about 200 nm to about 1,000 nm. While the broader range of wavelengths allows the sensor 126 to receive the wavelength of the primary beam 128, other wavelengths may be detected. For example, the sensor 126 may be sensitive to wavelengths of the process beam 118 and/or wavelengths produced at the heated area 121 of the substrate 108. The other wavelengths detected by the sensor 126 may be unnecessary for metrology uses, and may further cause deviations in the metrology information.

In one embodiment of the invention, a filter is utilized to attenuate the wavelengths that are unnecessary for metrology purposes. In one aspect, the sensor 126 may comprise a filter 132 that is utilized to limit the wavelengths received by the sensor 126 to only those wavelengths that are utilized in the metrology process. In another aspect, the window 120 may comprise a filter region 134 disposed at least partially about a perimeter thereof. The filter region 134 is generally positioned in the path of the secondary beam 130. The filter region 134 is utilized to limit wavelengths of the secondary beam 130, thereby blocking any light from the heated area 121 of the substrate 108 that is not utilized in the metrology process.

Embodiments of the filter 132 and the filter region 134 are utilized to block unnecessary wavelengths and/or light that may be detrimental to metrology determinations. The filter 132 and the filter region 134 may be an opaque member that is transmissive to specific wavelengths but attenuates other wavelengths. Examples of the filter 132 and the filter region 134 include bandpass filters, notch filters, high pass filters, low pass filters, and combinations thereof. In one embodiment, when the primary beam 128 comprises red light, the filter 132 and/or the filter region 134 may comprise colored glass that is transmissive to red light and attenuates any light other than red light. In a specific example, the filter 132 and/or the filter region 134 comprises an RG 610 glass filter.

The emitter 124 may also be affected by light from the process beam 118 and/or light from the heated area 121 of the substrate 108. For example, the emitter 124 may include an optical circuit 125 that is utilized to control beam modulation and intensity of the primary beam 128. The optical circuit 125 is configured to monitor real-time wavelength and intensity of the outputted beam and adjust the modulation and intensity of the beam based on the monitoring of the primary beam 128. The optical circuit 125 may be a mirror, a photo-detector, or other optical or photo-electric instrument, that is adapted to detect light and provide a metric of the detected light to a controller. However, the optical circuit 125 of the emitter 124 may be sensitive to light outside of the wavelengths associated with the primary beam 128. Thus, the emitter 124 may be affected by light from the process beam 118 and/or the light from the heated area 121 of the substrate 108, which may cause unnecessary adjustments to the outputted primary beam 128.

To alleviate unnecessary adjustments to the outputted primary beam 128 that may be caused by cross-talk between the light from the process beam 118 and/or the light from the heated area 121 of the substrate 108, the emitter 124 comprises a filter 136. The filter 136 may be an opaque member that is transmissive to specific wavelengths but attenuates other wavelengths that the optical circuit may be sensitive to, thereby limiting the wavelength received by the optical circuit. Examples of the filter 136 include a bandpass filter, a notch filter, a high pass filter, a low pass filter, and combinations thereof. In one embodiment, when the primary beam 128 comprises red light, the filter 136 may comprise colored glass that is transmissive to red light and attenuates any light other than red light. In a specific example, the filter 136 comprises an RG 610 glass filter.

The thermal processing chamber 100 also comprises a service door 138 that is coupled to the chamber body 102. The service door 138 is selectively openable to provide access to the processing volume 104 for servicing and/or maintenance of the thermal processing chamber 100. The service door 138 may be opened to provide access to personnel for adjusting the metrology system 122.

The service door 138 is in communication with a switching device 140. The switching device 140 is in communication with the controller. When the service door 138 is opened, a signal is sent to the controller to turn off the process laser system 110. Additionally, the switching device 140 provides a signal to the controller to position a secondary filter 142 proximate an aperture 144 of the emitter 124. The secondary filter 142 is provided as a safety mechanism that is adapted to attenuate the primary beam 128 to a level that is safe for human vision and human skin. The secondary filter 142 attenuates the primary beam 128, which allows personnel to make adjustments to the metrology system 122 without the need for tinted safety glasses and other protective gear. The secondary filter 142 may attenuate the primary beam 128 to an intensity equal to or less than the intensity of a commercially available laser pointer, such as a Class 1, a Class 1M, a Class 2, or a Class 2M laser pointer, as defined by standard 60825-1, promulgated by the International Electrotechnical Commission (IEC). The secondary filter 142 may be coupled to an actuator mechanism 146 adapted to move the secondary filter 142 from a first position that is clear of the primary beam 128 to a second position that attenuates the primary beam 128. The actuator mechanism 146 may comprise a controller (not shown in FIG. 1) coupled to a pivoting device or a linear slide device (both not shown in FIG. 1).

Figure 2A:
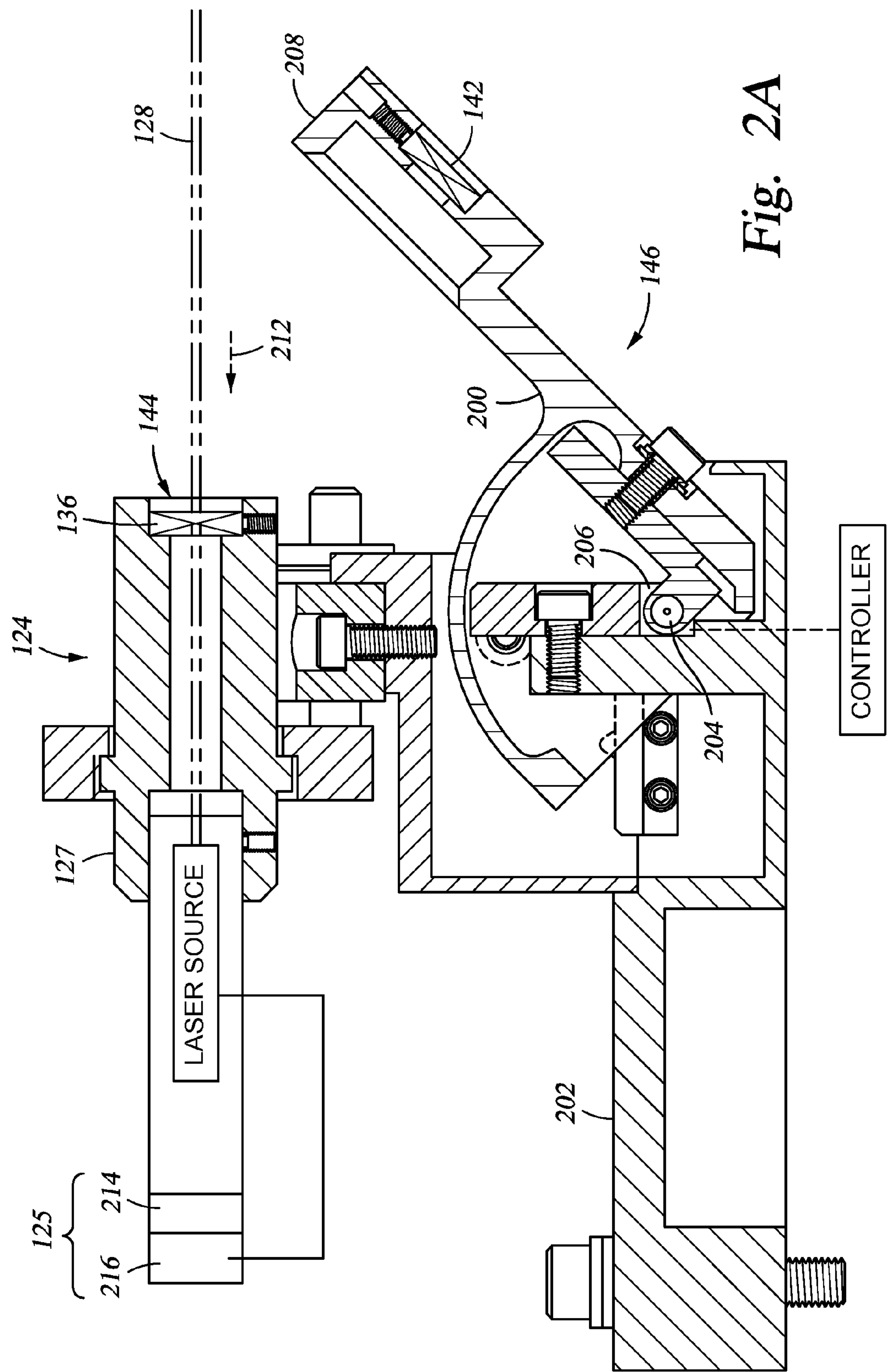
FIGS. 2A and 2B are side cross-sectional views of one embodiment of an actuator mechanism that may be utilized with the metrology system of FIG. 1.
Figure 2B:
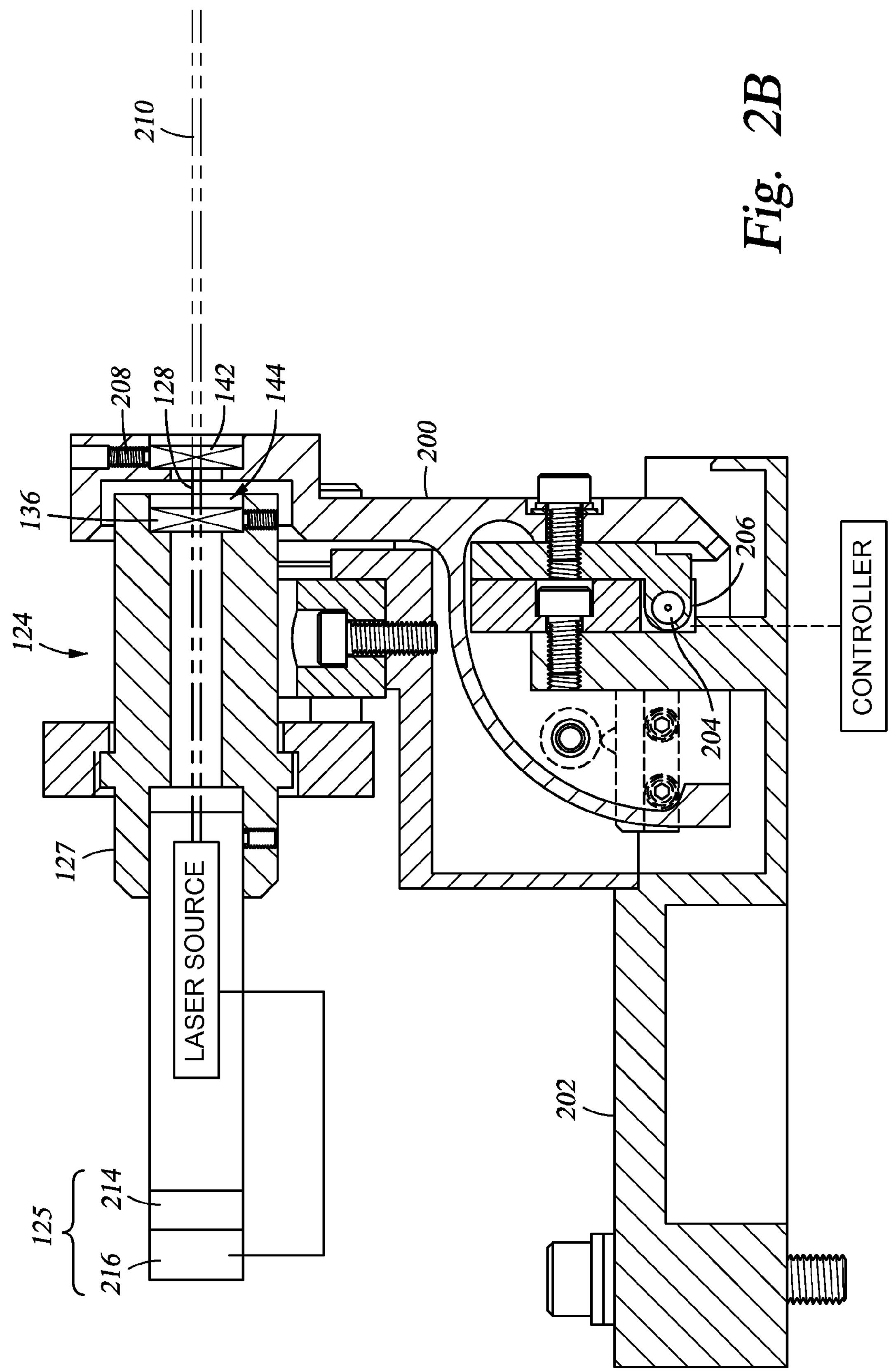

FIGS. 2A and 2B are side cross-sectional views of one embodiment of an actuator mechanism 146 that may be utilized with the metrology system 122 of FIG. 1. FIG. 2A shows the actuator mechanism 146 in a process position where the secondary filter 142 is clear of the primary beam 128. FIG. 2B shows the actuator mechanism 146 in a service position where the secondary filter 142 is at least partially blocking the primary beam 128.

The actuator mechanism 146, in this embodiment, comprises a pivoting member 200. The pivoting member 200 is coupled to a base 202 that may be coupled to the chamber body 102 (shown in FIG. 1) by fasteners, such as bolts or screws. The pivoting member 200 includes a proximal end that is coupled to a shaft 204. The shaft 204 is coupled to a motor 206 that rotates the shaft 204 and the pivoting member 200 at an angle of about 45 degrees, based on commands from the controller. A distal end of the pivoting member 200 comprises a cap 208 that contains the secondary filter 142.

When the service door 138 (shown in FIG. 1) is opened, the cap 208 is moved to a position adjacent the aperture 144 of the emitter 124, as shown in FIG. 2B. In one embodiment, the pivoting member 200 is manually controlled, such as by a switch in communication with the motor 206 that is controlled by an operator. In another embodiment, the controller actuates the motor 206 when the service door 138 is opened. In these embodiments, the pivoting member 200 is actuated to swing the cap 208 to a position adjacent the aperture 144 of the emitter 124. In this position, the primary beam 128 is attenuated by the secondary filter 142 to an attenuated beam 210. The attenuated beam 210 has an intensity that is about 2 orders of magnitude less than the intensity of the primary beam 128. While the primary beam 128 is weakened by the secondary filter 142, the attenuated beam 210 is powerful enough for adjustment of the metrology system 122. Thus, personnel may adjust the metrology system 122 and perform any other maintenance or service within the processing volume 104 of the thermal processing chamber 100 without fear of injury. When the service door 138 is closed, the controller actuates the motor 206 to move the pivoting member 200 and the cap 208 to a position away from the aperture 144 of the emitter 124, as shown in FIG. 2A. In this position, the primary beam 128 is un-attenuated, and the metrology system 122 may function normally during an annealing process.

FIGS. 2A and 2B also show one embodiment of the emitter 124 and the optical circuit 125. In normal operation, the primary beam 128 is provided by a laser source disposed in the housing 127 of the emitter 124, and the primary beam 128 is monitored by a photo-electric instrument 214. Information about the properties of the primary beam 128 is provided to an internal controller 216. The internal controller 216 adjusts power application to the laser source based on the information from the photo-electric instrument 214. The emitter 124 functions properly when the main light source is the primary beam 128. However, when another light source is present, the optical circuit 125 may register a false signal based on the other light source, which causes the internal controller 216 to errantly adjust the primary beam 128. As shown in FIG. 2A, ambient light 212 may be directed toward the aperture 144 of the emitter 124. The ambient light 212 may be light from the process beam 118 and/or the heated area 121 of the substrate 108 as shown in FIG. 1. If the ambient light 212 enters the emitter 124, the ambient light 212 may be detected by the photo-electric instrument 214, and the primary beam 128 may be adjusted based on an errant signal from the photo-electric instrument 214. However, the filter 136 disposed on the emitter 124 prevents the ambient light 212 from entering the housing 127 and creating a false signal in the optical circuit 125.

While the foregoing is directed to embodiments of the invention, other and further embodiments of the invention may be devised without departing from the basic scope thereof, and the scope thereof is determined by the claims that follow.

The invention claimed is:

1. A system for processing a substrate, the system comprising:
- a chamber having a processing volume;
- a first laser device to emit a beam at a first wavelength into the processing volume; and
- a second laser device to emit a beam at a second wavelength into the processing volume, wherein the second wavelength is greater than the first wavelength, and the second laser device comprises a filter that is transmissive to the second wavelength and attenuates the first wavelength.

2. The system of claim 1, wherein the filter comprises a first filter that is disposed in a beam path of the first laser device.

3. The system of claim 2, wherein the first filter is disposed in a beam path of the second laser device.

4. The system of claim 1, wherein the second laser device is in communication with a sensor.

5. The system of claim 4, wherein the sensor comprises a filter that attenuates the first wavelength.

6. The system of claim 2, wherein the second laser device comprises a second filter that selectively attenuates the second wavelength.

7. The system of claim 6, wherein the second filter is coupled to an actuator.

8. The system of claim 7, wherein the actuator is coupled to a pivoting member that at least partially contains the second filter.

9. A system for processing a substrate, the system comprising:
- a chamber having an internal volume;
- a first laser emitter configured to emit a process beam into the internal volume; and
- a metrology system disposed at least partially within the internal volume, the metrology system comprising:
  - a second laser emitter, comprising:
    - a housing;
    - a laser source disposed in the housing, the laser source generating a primary beam that is directed through an aperture in the housing;
    - a first filter disposed on the housing and covering the aperture; and
    - a sensor having a second filter, the sensor being in communication with the primary beam, wherein the first and second filters are transmissive to the primary beam and attenuate the process beam.

10. The system of claim 9, wherein the second laser emitter further comprises a third filter.

11. The system of claim 10, wherein the third filter is movably coupled to the housing.

12. The system of claim 10, wherein the third filter attenuates the primary beam.

13. The system of claim 9, wherein the second laser emitter is disposed in the internal volume.

14. The system of claim 13, wherein the sensor is disposed in the internal volume.

15. A method for processing a substrate, comprising:
- emitting a process beam at a first wavelength toward a portion of a substrate;
- emitting a primary beam at a second wavelength toward the portion of the substrate, wherein the second wavelength is different than the first wavelength; and
- receiving, within a sensor, a reflected beam from the substrate, wherein the reflected beam that is received in the sensor consists essentially of the second wavelength.

16. The method of claim 15, wherein the primary beam is controlled by an internal optical circuit that is sensitive to the first wavelength and the second wavelength.

17. The method of claim 16, wherein the first wavelength is filtered from the internal optical circuit.

18. The method of claim 15, wherein the primary beam includes a first intensity, the method further comprising:
- attenuating the primary beam to a second intensity.

19. The method of claim 18, wherein attenuating the primary beam to the second intensity comprises positioning a filter in the path of the primary beam.

20. The method of claim 19, wherein the second intensity is about 2 orders of magnitude less than the second wavelength.

* * * * *